United States Patent [19]

van Roermund

[11] Patent Number: 4,616,185
[45] Date of Patent: Oct. 7, 1986

[54] MULTIPLYING CIRCUIT COMPRISING SWITCHED-CAPACITOR CIRCUITS

[75] Inventor: Arthur H. M. van Roermund, Eindhoven, Netherlands

[73] Assignee: U.S. Philips Corporation, New York, N.Y.

[21] Appl. No.: 630,510

[22] Filed: Jun. 13, 1984

[30] Foreign Application Priority Data

Jul. 20, 1983 [NL] Netherlands ................... 8302591

[51] Int. Cl.[4] ...................... H03B 19/00; H03C 1/00
[52] U.S. Cl. ................................ 328/160; 307/529; 364/703; 375/24
[58] Field of Search .............. 328/158, 160; 307/498, 307/529; 329/109; 364/754, 841–844, 703; 375/24, 41

[56] References Cited

U.S. PATENT DOCUMENTS

| | | | |
|---|---|---|---|
| 3,611,143 | 10/1971 | van Gerwen Enmasingel | 375/41 |
| 3,869,670 | 3/1975 | Grutzmann et al. | 375/41 |
| 4,006,353 | 2/1977 | Pierce | 364/841 |
| 4,517,655 | 5/1985 | Claasen et al. | 375/24 |

OTHER PUBLICATIONS

Allstot et al., "A Switched Capacitor N-Path Filter", IEEE Sym. on Circuits and Systems, May 1980, pp. 313–316.

Primary Examiner—Stanley D. Miller
Assistant Examiner—Timothy P. Callahan
Attorney, Agent, or Firm—Thomas A. Briody; William J. Streeter; Leroy Eason

[57] ABSTRACT

Multiplying circuit for multiplying a first signal x(t) by a periodic second signal y(t) and being particularly suitable for use as an amplitude demodulator in a stereo decoder or in a phase-locked loop. It comprises N signal channels 26(k) wherein k=0, 1, ... n−1, each receiving the first signal x(t) and each producing a channel signal. Each signal channel is formed by, arranged in cascade, a switched-capacitor circuit 28(k;1), 28(k;2), 29(k), the circuit included in the signal channel being controlled by a train of control pulses g(k,i) which each have a finite duration and occur with a repetition period $T_o$ and at instants $t_o+k(T_o/N)+iT_o$ where i= ... −2, −1, 0, 1, 2, 3, ..., means 29(k), 31, 30 for multiplying the amplitude of the signal x(t) by a constant weighting factor W(k) which is equal to $y(t_o+k(T_o/N))$, pulse-reshaping means 29(k), 30, 31 for converting a pulse applied thereto into a pulse having a predetermined duration. The channel signals thus obtained are added together in an adder device 30, 31 to form a sum signal. This sum signal is sampled in a sampling arrangement 34(1), 34(2), 35 at instants comprised within the interval between the end of a control pulse g(k,i) and the beginning of the subsequent control pulse g(k+1,i).

3 Claims, 12 Drawing Figures

MULTIPLYING CIRCUIT COMPRISING SWITCHED-CAPACITOR CIRCUITS

BACKGROUND OF THE INVENTION (1) Field of the Invention

The invention relates to a multiplying circuit for multiplying a first signal x(t) by a periodic second signal y(t). It is particularly suitable for use as an amplitude demodulator in a stereo decoder or in a phase-locked loop (PLL) and comprises circuits constructed with switched capacitors.

(2) Description of the Prior Art

As is known, an amplitude demodulator has for its function to convert a band-limited signal $s(nf_o;t)$ whose frequency spectrum is located in a frequency band extending from the frequency $(nf_o-f_1)$Hz to a frequency $(nf_o+f_1)$Hz, into an AF-signal x(n;t) whose frequency spectrum is located in the frequency band extending from the frequency 0 Hz to the frequency $f_1$ Hz. The last-mentioned frequency band will be called AF-band (Audio Frequency band) hereinafter. In the foregoing both $f_o$ and $F_1$ are a fixed frequency and n is an integer.

In practice $x(nf_o;t)$ will form part of a signal $x'(t)$ which in principle is formed by an infinite number of frequency-stacked band-limited signals. As usually only one of these band-limited signals must be translated to the AF-band (for example only the signal $x(f_o;t)$), the amplitude demodulator comprises what is commonly denoted as a pre-modulation filter to which $x'(t)$ is applied and which converts it into a signal x(t) which comprises only a limited number, for example N, of these band-limited signals. Let it now be assumed that each of these band-limited signals can be written as:

$$x(nf_o;t)=x(n;t) \sin (2\pi nf_o t+\phi_n)$$

When now x(t) is multiplied by a periodic carrier signal y(t) which satisfies, for example, the expression:

$$y(t)=2 \sin (2\pi f_o t+\phi_1)$$

a product signal z(t) is obtained which in addition to the AF-signal x(1;t) located in the AF band comprises N−2 further signals located around multiples of the frequency $f_o$. When this signal z(t) is now applied to a post-modulation filter the signals located around these multiples of $f_o$ can be suppressed so that this filter supplies the AF-signal z(1;t) as an output signal.

If the carrier signal y(t) were indeed of a purely sinusoidal shape and the multiplying circuit were to operate in a purely linear way, then only the signal x(1;t) would indeed occur in the AF band. In practice, however, it was found to be impossible to produce a purely linear multiplying circuit in a simple and cheap way. It was also found to be impossible to generate a purely sinusoidally varying carrier signal in a simple way. The result thereof is that in this demodulation procedure noise signals are also introduced in the AF-band, which signals may be particularly annoying.

In order to prevent these noise signals from occurring it is at present general practice to feed into stereo decoders a carrier signal which in contrast to the above mentioned sinusoidally varying carrier signal is not amplitude-continuous but which is amplitude-discrete and consequently can only assume a limited number of predetermined amplitude values. This may result in the carrier signal y(t) not comprising certain components whose frequencies are an integral multiple of $f_o$, so that those signals $x(nf_o;t)$ located around those frequencies do not arrive in the AF-band.

A particularly advantageous multiplying circuit of this type is described in Reference 1. It comprises N-signal channels each receiving the first signal x(t) via a signal input. Each signal channel includes a switching circuit having a control input for receiving control pulses. More specifically the control input of the switching circuit included in the signal channel having number k receives control pulses d(k,i), where k=0, 1, 2, ..., N−1 and i=... −2, −1, 0, 1, 2, 3, .... In addition, each signal channel comprises, arranged in cascade with the switching circuit, a weighting network having a constant weighting factor $W(k)=y(t_o+k(T_o/N))$, where $T_o$ represents a constant, and a pulse-reshaping circuit for converting a pulse applied thereto into a pulse whose width is not more than equal to $1/f_o$. Each signal channel supplies a channel signal consisting of a sequence of pulses whose amplitudes are equal to the product of the first signal x(t) and the constant weighting factor and whose width is determined by the pulse-reshaping circuit. The channel signals thus obtained are added together in an adder to form the desired product signal.

The N sequences of control pulses d(k;i) with which the switching circuits are controlled, are generated by a control pulse generator circuit of such a construction that each sequence of control pulses is periodic and has a repetition period $T_o=1/f_o$, and any control pulse d(k;i) occurs at the instant $t_o+k(T_o/N)+iT_o$.

In a particularly advantageous embodiment of this multiplying circuit each signal channel comprises a capacitor having a capacitance C(k) which together with the associated switching circuit forms part of a circuit comprising a switched capacitor. This last-mentioned circuit is further followed by an operational amplifier which is shunted by a capacitor having a capacitance C and functions as a pulse-reshaping circuit. In this signal channel the weighting network is formed by the series arrangement of the two capacitors and the weighting factor W(k) of this weighting network is equal to the ratio C(k)/C of the two capacitances. In a practical embodiment of this multiplying circuit the operational amplifier and the capacitor shunting it are used in common for all signal channels and it then also functions as an adder device.

For this arrangement it is assumed that the pulse duration of the pulses of which the channel signal consists is only determined by the pulse-reshaping circuit and that the control pulses d(k;i) represent delta (dirac) pulses. In practice this ideal situation can, however, not be realized as the switching circuit has a resistance which is too high to be disregarded. As a result thereof a certain time is required, (charging time constant) to charge the capacitor C(k) to a value corresponding to the instantaneous value of the information signal x(t). This means that the switching circuit cannot be controlled directly by the sequence of delta pulses d(k;i) but that each delta pulse must be converted in a pulse-reshaping circuit into a control pulse g(k;i) of an adequate duration. As the sequence of control pulses g(k;i) thus obtained has a frequency spectrum which significantly deviates from that of the sequence of delta pulses, the frequency spectrum of the product signal also deviates significantly from the desired frequency spectrum. In practice this product signal was found to be further disadvantageously influenced by the fact that the switched capacitors C(k) in the different signal channels have different values. As a result thereof the charging time constants in the different signal channels are different.

OBJECT AND SUMMARY OF THE INVENTION

The invention has for its object to provide a multiplying circuit in which the above-mentioned disadvantages are eliminated to a very great extent.

According to the invention, the multiplying circuit therefore comprises:

a multiplying circuit input for receiving the first signal x(t) and a multiplying circuit output for supplying a product signal;

N signal channels each connected to the multiplying circuit input for receiving the first signal, each producing a channel signal and each comprising:

a switched-capacitor circuit, the circuit included in the signal channel having number k being controlled by a train of control pulses g(k;i) each having a finite duration and where k=0, 1, 2, .. ., N−1, i=..., −2, −1, 0, 1, 2, 3, ...

means for multiplying the amplitude of the received first signal x(t) by a constant weighting factor W(k) equal to $y(t_o + k(T_o/N))$, where $T_o$ and $t_o$ represent constants;

pulse-reshaping means arranged in cascade with the said circuit for converting a pulse applied thereto into a pulse having a predetermined duration.

means for adding together the N channel signals for generating a sum signal;

a sampling circuit for sampling the sum signal at instants comprises within the interval between the ends of a control pulse g(k;i) and the beginning of the control pulse g(k+1;i) and whose output is coupled to the multiplying circuit output;

a pulse generator circuit for generating the train of control pulses g(k;i), these control pulses occurring with a pulse repetition period $T_o$ and at instants $t_o + k(T_o/N) + iT_o$.

The sampling circuit produces samples of the sum signal, the value of these samples being independent of the duration of the control pulses, so that these pulse may again be considered as delta pulses. Since the sampling pulses occur after the ends of the control pulses and as at that moment the capacitors of the different switched-capacitor circuits are not further charged, the amplitude values of the samples of the sum signal are independent of mutually different charging time constants in the different signal channels.

REFERENCES

1. Vermenigvuldigschakeling voor stereodecoders; Netherlands Patent Application No. 8104668 to which U.S. patent application No. 416737 corresponds (now issued as U.S. Pat. No. 4517655).

2. Modern Filter Design; M. S. Ghausi, K. R. Laker; Prentice-Hall Inc., ISBN O-13-594663-8, Chapter 2 in particular, pages 70 etc.

3. A switched capacitor N-path filter; D. J. Allstot, K. S. Tan; 1980, IEEE International Symposium on Circuits and Systems Proceedings, Houston, Tex., Apr. 29–30, 1980, pages 313–316.

SHORT DESCRIPTION OF THE FIGURES

DESCRIPTION OF PRIOR ART MULTIPLYING CIRCUIT

Introduction

Figure 1:
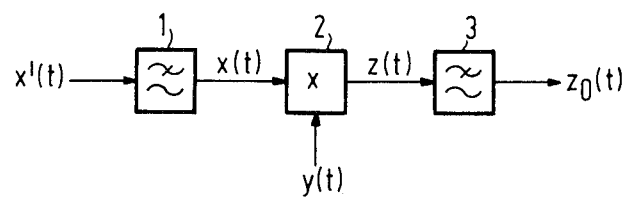
FIG. 1 is a block-diagram of an amplitude demodulator.

As has already been mentioned above and as shown in FIG. 1 by means of a block diagram, an amplitude demodulator generally comprises a premodulation filter 1, a multiplying circuit 2 and a post-modulation filter 3. A signal x'(t) is filtered and converted by the pre-modulation filter 3 into the first signal x(t). The multiplying circuit 2 multiplies x(t) by the carrier signal y(t), the product signal $z(t) = x(t) \cdot y(t)$ then being obtained. This product signal is filtered by the post-modulation filter 3 which thus produces an output signal $z_o(t)$ which is, for example, equal to the above-mentioned AF-signal x(1;t).

The first signal x(t) represents, for example, what is commonly referred to as a stereo multiplex signal which is defined by the expression:

$$x(t) = \{L(t) + R(t)\} + \{L(t) - R(t)\} \sin (2\pi f_o t + \phi)$$

Herein L(t) is the left-hand signal and R(t) is the right-hand signal. The frequency $f_o$ is usually equal to 38 kHz. If now this stereo multiplex signal is multiplied by a carrier signal y(t) of the following general form $$y(t) = p + q \sin (2\pi f_o t + \phi)$$

where p and q are constants, then in the product signal z(t) the AF-signal is formed by: either the signal L(t), namely when p=1 and q=2 or the signal R(t), namely when p=1 and q=−2 or the signal L(t)−R(t), namely when p=0 and q=1. In the last-mentioned case the sum signal L(t)+R(t) can be separated from the stereo multiplex signal x(t) with the aid of a low-pass filter. If this sum signal is applied in known manner together with the difference signal L(t)−R(t) to a matrix circuit, then this matrix circuit produces the left-hand signal L(t) and the right-hand signal R(t) separate from each other.

Figure 2:
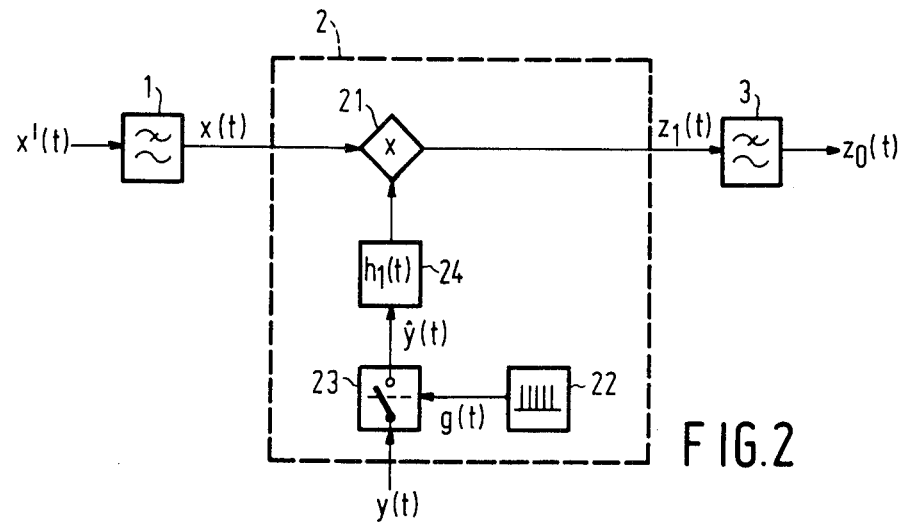
FIG. 2 shows a first and FIG. 3 a second block diagram of prior art multiplying circuits for use in the amplitude demodulator of FIG. 1.
Figure 3:
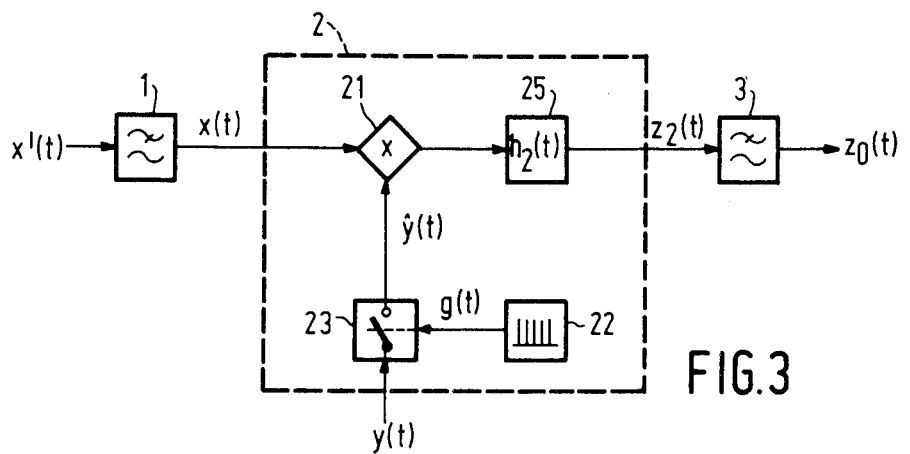

Reference 1 describes that it is advantageous to construct the multiplying circuit 2 in the manner as shown schematically in FIG. 2, or in FIG. 3. These embodiments each comprise a multiplier 21 and a clock pulse generator 22 producing a serie of delta pulses g(t) at a rate equal to $f_s=1/T_s=Nf_o=N/T_o$ which are applied as sampling pulses to a sampling circuit 23 in which the carrier signal y(t) is sampled and which thus produces a sampled version $\hat{y}(t)$ of this carrier signal. In the embodiment shown schematically in FIG. 2 this signal $\hat{y}(t)$ is applied to the multiplier 21 via a pulse-reshaping circuit 24. This multiplying circuit thus produces a product signal $z_1(t)$. In the embodiment shown schematically in FIG. 3, this signal $\hat{y}(t)$ is applied directly to the multiplier 21. However, also this multiplying circuit comprises a pulse-reshaping circuit 25 which is here connected to the output of the multiplier 21, so that this multiplying circuit produces the product signal $z_2(t)$. Let it be assumed that the pulse-reshaping circuit 24 has an impulse response $h_1(t)$ and that the pulse-reshaping circuit 25 has an impulse response $h_2(t)$.

Figures 4, 6:
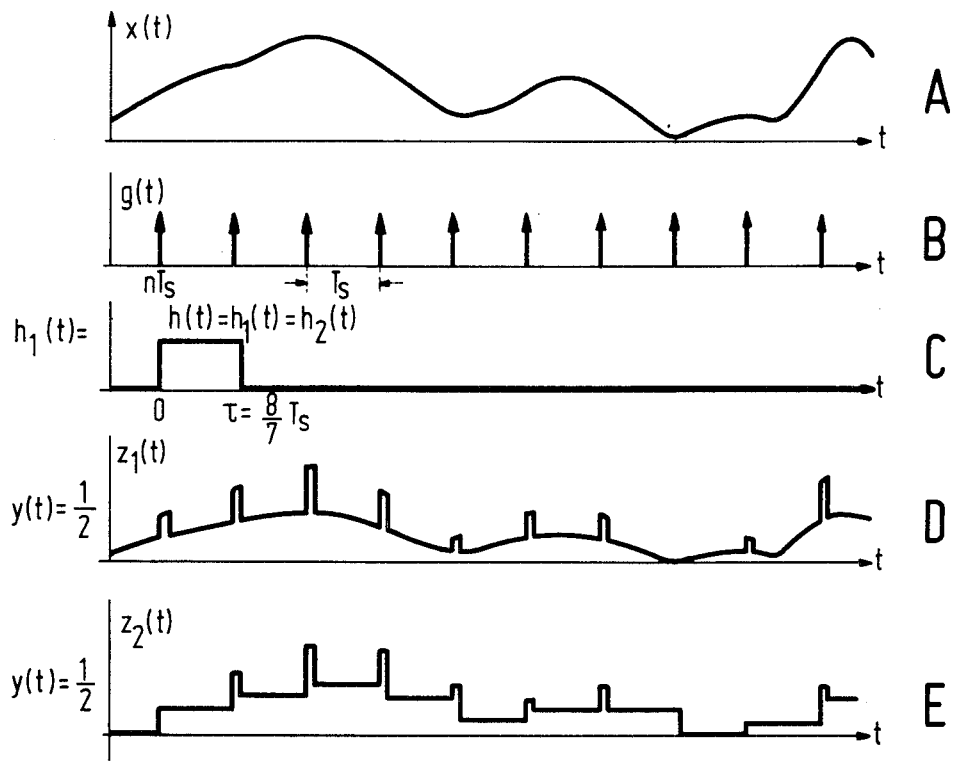
FIG. 4 shows some time diagrams to explain the operation of the prior art circuits shown in FIGS. 2 and 3.
FIG. 6 is a Table showing possible values of the weighting factors W(k) provided by the circuit in FIG. 5.

So the difference between these two multiplying circuits is in the position of the pulse-reshaping circuit and consequently also in their mode of operation. The different modes of operation of these two multiplying circuits is shown schematically in FIG. 4. More specifically, FIG. 4A shows a portion of the first signal x(t) and FIG. 4B shows the train of delta pulses g(t) generated by the clock pulse generator 23. If now the impulse responses $h_1(t)$ and $h_2(t)$ are equal to each other and have the shape shown in FIG. 4C and it being assumed that y(t)=½ for all values of t, then $z_1(t)$ has roughly the shape shown in FIG. 4D and $z_2(t)$ has roughly the shape shown in FIG. 4E.

A specific prior art multiplying circuit

Figure 5:
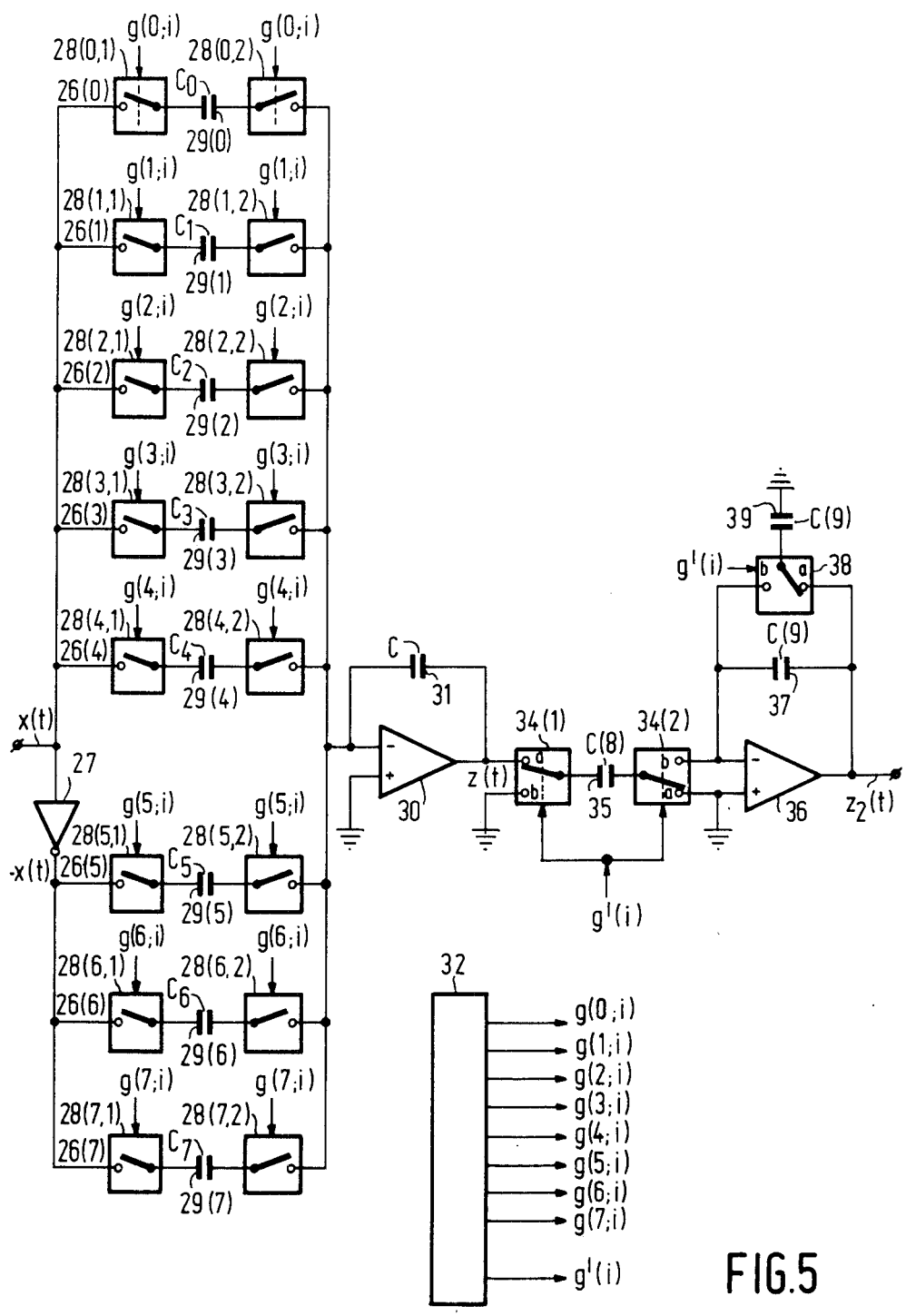
FIG. 5 shows a specific example of a prior art multiplying circuit in accordance with FIG. 3 but including modifications in accordance with the invention.

The multiplying circuit shown in block form in FIG. 3 is perfectly suitable as construction for a stereo decoder, with the aid of circuits comprising switched capacitors. A specific multiplying circuit constructed in this way, in which the pulse-reshaping circuit 25 has an impulse response $h_2(t)$ whose shape is shown in FIG. 4C, but where $\tau=8t_s$ and N=8, has already been described in Reference 1 and is shown in FIG. 5. This multiplying circuit comprises N(N=8) signal channels 26. The signal channels 26(0)–26(4) receive the first signal x(t) and the signal channels 26(5)–26(7) receive the signal −x(t) which represents the polarity-inverted version of x(t). This polarity inversion is effected by an inverter circuit 27. Each signal channel comprises a switching circuit formed by the two switches 28(k,1) and 28(k,2) which are controlled by control pulses g(k;i). A capacitor 29(k) which has a capacitance C(k) is arranged between these two switches. In conjunction with the two switches this capacitor forms a so-called "switched capacitor circuit". This circuit is further followed by an operational amplifier 30 which is shunted by a capacitor 31 having capacitance C and is used in common by all signal channels. As follows from the generally known theory of the switched capacitor circuits, see for example, References 2 and 3, this operational amplifier 30 operates together with this capacitor 31 for each signal channel as a pulse-reshaping circuit which converts a pulse produced by the switched capacitor circuits into a pulse of a length $NT_s$ and, in addition, this amplifier operates as an adder adding all these pulses together. More specifically, the contribution of the signal channel having number k to the output voltage of the operational amplifier 30 is equal to $(-C(k)/C)\{x[g(k;i+1)]-x[g(k;i)]\}$. Herein x[g(k;i)] represents the value of the signal x(t) at the instant at which the control pulse g(k;i) occurs. The quotient C(k)/C represents the weighting factor W(k) which is characteristic of the relevant signal channel. As is extensively described in Reference 1 these weighting factors are determined by the values the carrier signal y(t) has at the instants at which the different control pulses occur. More specifically it then holds that:

$$W(K)=(C(k)/C)=y(t_o+k(T_o/N))$$

where $t_o$ represents a constant. If $t_o=$ is chosen to be zero, then it is, for example, possible to assign to these weighting factors the values as shown in the Table of FIG. 6 for N=8. It should then be noted that the negative weighting factors C(5)/C, C(6)/C and C(7)/C are realized by first inverting the polarity of the signal x(t) in the inverter 27 and by thereafter applying it to the signal channels 26(5), 26(6) and 26(7).

Figure 7:
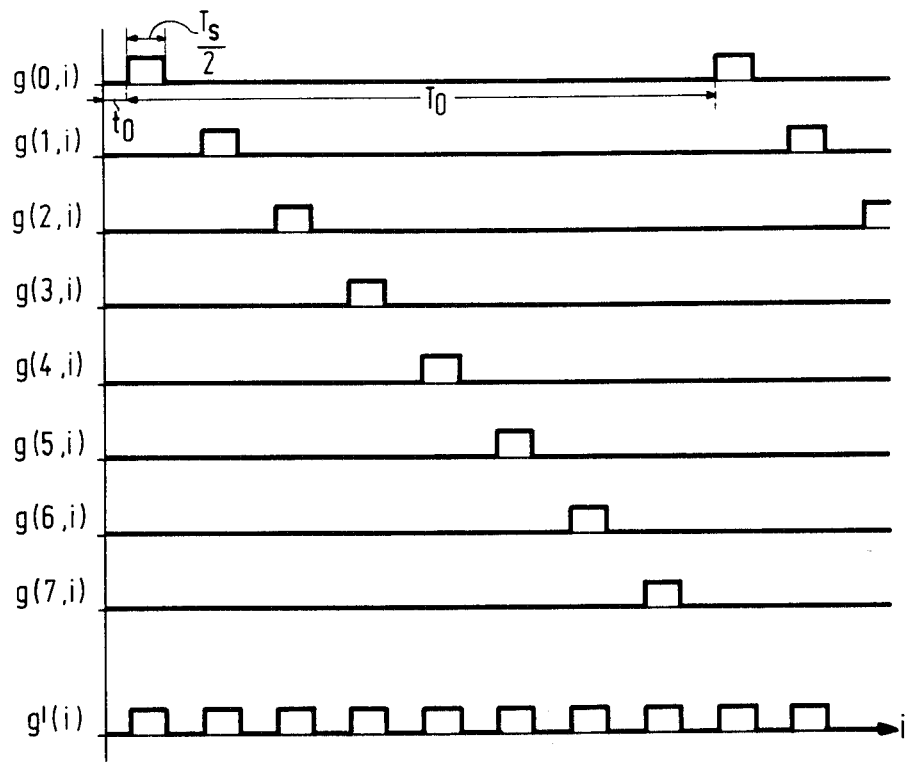
FIG. 7 shows in some time diagrams the different control signals required for controlling the multiplying circuit shown in FIG. 5.
Figure 8:
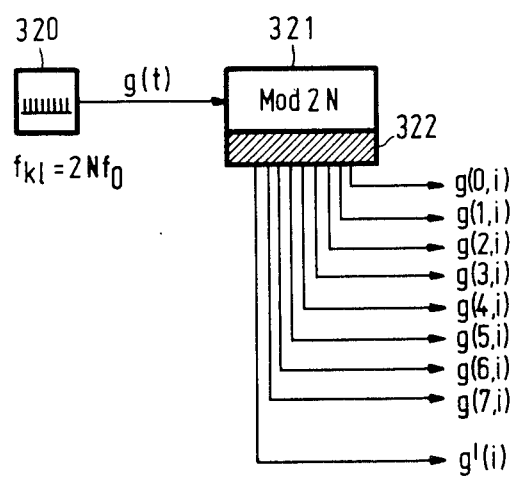
FIG. 8 shows an embodiment of a pulse generator circuit for generating the control signals in FIG. 5.

The control pulses g(k;i) are generated by the pulse generator circuit 32 and that in such a way that as shown in FIG. 7 those control pulses g(k;i) which are applied to the switches 28(k,1) and 28(k,2) occur with a repetition rate $T_o$ and at instants $t_o+k(T_o/N)+iT_o$. For the sake of completeness, an embodiment of this pulse generator circuit is shown in FIG. 8. It comprises a clock pulse generator 320 which produces the delta pulses g(t) at a rate of, for example, $f_{k1}=2Nf_o$. In addition, it comprises a modulo-2N counter 321 and a decoding network 322 connected thereto. Each time the counting position 0000 occurs a control pulse g(0,t) is produced. If the counting position is 0010 then a control pulse g(1,t) is produced and each time the counting position is 0100 a control pulse g(2,t) is produced, etc. No control pulse is produced at any odd value of the counting position.

DESCRIPTION OF THE PREFERRED
EMBODIMENTS OF THE INVENTION

As has already been mentioned in the foregoing, the portion of the circuit in FIG. 5 thus far described has been considered to be a practical embodiment of the multiplying circuit shown schematically in FIG. 3. This means that, the polarity excepted, the signal z(t) produced by the operational amplifier 30 must be identical to the signal $z_2(t)$ such as it is produced by the pulse reshaping circuit 25 (see FIG. 3). If it is again assumed that for all values of t it holds that y(t)=½ and that the pulse duration $\tau$ of the impulse response $h_2(t)$ is equal to $NT_s=T_o$ then the multiplying circuit 2 shown in FIG. 3 produces in response to the signal x(t) shown in FIG. 4A the product signal $z_2(t)$ whose shape is shown in FIG. 9A.

As has already been described in the foregoing the switches 28(...) have a certain resistance and a certain time is required to charge the capacitor 29 (charging time constants) to a voltage equal to the instantaneous value of x(t). Hence, the control pulses g(k,i) must have a measurable width. In the circuit in FIG. 5 this width has been chosen equal to $T_s/2$. The result thereof is that the above-described portion of the circuit shown in FIG. 5 does not represent an actual practical embodiment of the multiplying circuit shown schematically in FIG. 3, but rather the practical embodiment of the multiplying circuit shown schematically in FIG. 10. This embodiment is formed by a multiplying circuit 220 and a multiplying circuit 221. Multiplying circuit 220 is of a construction as shown in FIG. 2, to the effect that the clock pulse generator 22 now produces delta pulses $\hat{y}(t)$ which occur half a clock pulse period $T_s/2$ earlier than the delta pulses g(t), so that $\hat{g}(t)=g(t+T_s/2)$. Multiplying circuit 221 is then of the construction shown in FIG. 3. The signal x(t) is applied to both multiplying circuits and the product signals $z_1(t)$ and $z_2(t)$, respectively produced by these multiplying circuits are added together in an adder device 33 whereby the signal z(t) produced by the operational amplifier 30 is obtained. The impulse response $h_1(t)$ then has the pulse shape shown in FIG. 9b with a pulse duration $\tau = T_s/2$ and the impulse response $h_2(t)$ has the pulse shape shown in FIG. 9c with pulse duration $\tau = 8 T_s - T_s/2$. So in actual practice the signal z(t) produced by the operational amplifier 30 in FIG. 5 does not have the shape shown in FIG. 9A but the shape shown in FIG. 9D.

Figure 9:
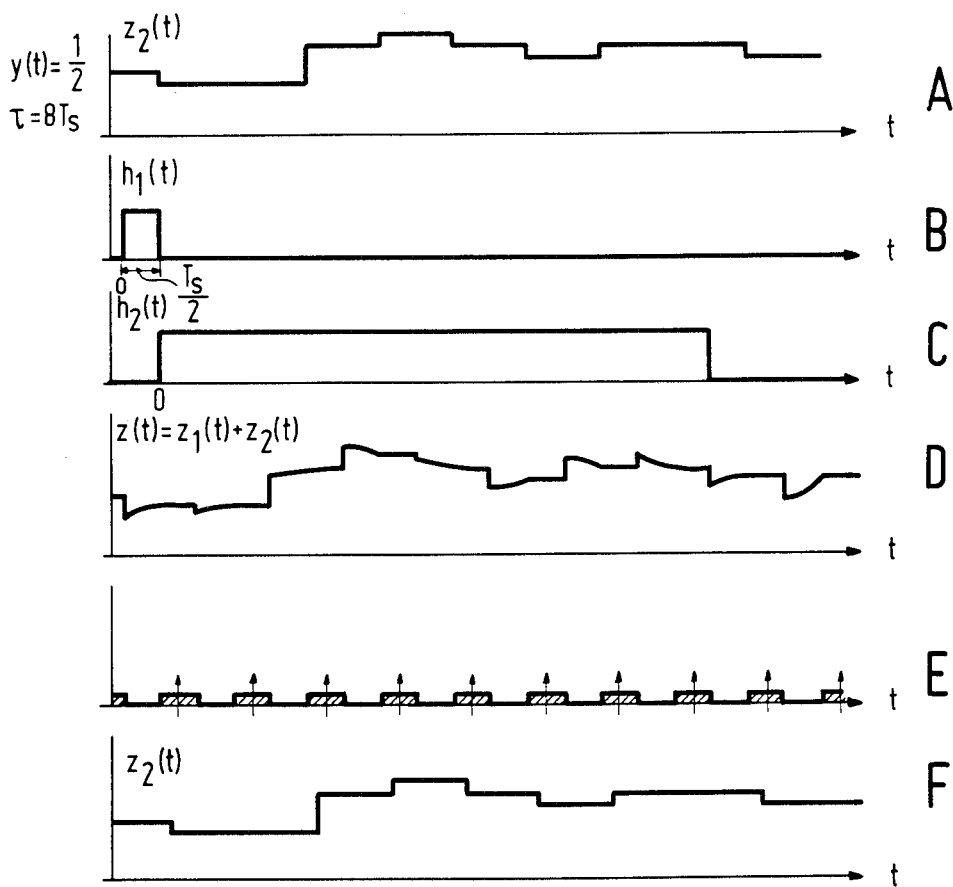
FIG. 9 shows some time diagrams to explain the operation of the multiplying circuit shown in FIG. 5.
Figure 10:
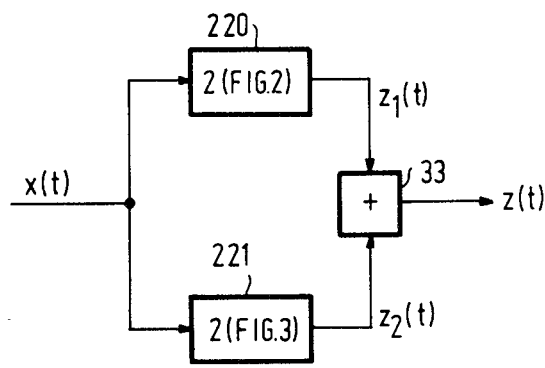
FIG. 10 shows symbolically the operation of the multiplying circuit shown in FIG. 5.

In order to actually obtain the desired product signal $z_2(t)$ shown in FIG. 9A, in accordance with the invention a further switched-capacitor circuit is connected to the output of the operational amplifier 30, such circuit being formed by the two switches 34(1) and 34(2) and the capacitor 35 having a capacitance C(8). The switches 34(1) and 34(2) each have a switching position a and a switching position b and are controlled by the control pulse g'(i) shown in FIG. 7 and occurring with a period $T_s$, a duration of, for example, $T_s/2$ and each coinciding with a control pulse g(k,i). As is already shown in FIG. 5 and in FIG. 8 these control pulses are also produced by the pulse generator circuit 32. More specifically such a control pulse occurs each time the counting position of the modulo-2N counter in FIG. 8 is even.

The output of switch 34(2) is preferably connected to the input of an operational amplifier 36, which is shunted by a capacitor 37 having a capacitance C(9) and which thus produces the signal $z_2(t)$.

In response to a control pulse g'(t) the switches 34(1) and 34(2) are adjusted to the switching position a. In this switching position capacitor 35 is switched between the output of operational amplifier 30 and ground, so that this capacitor is charged to a voltage equal to the instantaneous value of z(t). When all of a sudden the control pulse g'(i) is no longer present, the switches 34(1) and 34(2) are adjusted to the switching position b, causing capacitor 35 to be switched between ground and the input of operational amplifier 36, so that capacitor 37 is charged further in a very short period of time, until the whole charge of capacitor 35 has been conveyed to capacitor 37. If C(8)=C(9), the signal $z_2(t)$ whose shape is shown in FIG. 9F occurs at the output of operational amplifier 36.

As the switched-capacitor circuit comprising switches 34(1) and 34(2) and capacitor 35 conveys a certain signal value to the operational amplifier 36, namely only that signal value z(t) had at the end of the control pulse g'(i), this switched-capacitor circuit represents a sampling arrangement which is controlled by the control pulses g'(i). More specifically, the signal z(t) is sampled each time a trailing edge of a control pulse g'(i) occurs. To obtain the signal shown in FIG. 9A this trailing edge must generally speaking, be located in an interval of which several are shown in FIG. 9E by means of hatching. Each interval is located between the end of a control pulse g(k,i) and the beginning of the subsequent control pulse g(k+1,i).

Together with capacitor 37, the operational amplifier 36 operates as a hold circuit. To prevent it from also effecting an integrating function, capacitor 37 is shunted by a switch 38 which is also controlled by the control pulses g'(i) and one pole of which is connected to ground potential via a capacitor 39 having capacitance C(9). When a control pulse g'(i) is present, switch 38 is in the switching position a and capacitor 39 is charged to the same voltage as to which capacitor 37 has been charged. If no control pulse g'(i) is produced, then switch 38 is adjusted to the switching position b, causing capacitor 39 to convey its charge to capacitor 37 which is first discharged thereby and is thereafter charged by the charge conveyed from capacitor 35 to capacitor 37.

Figure 11:
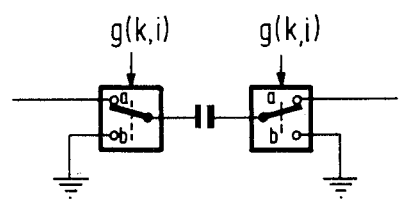
FIG. 11 and FIG. 12 show some modifications which can be made in the multiplying circuit shown in FIG. 5.
Figure 12:
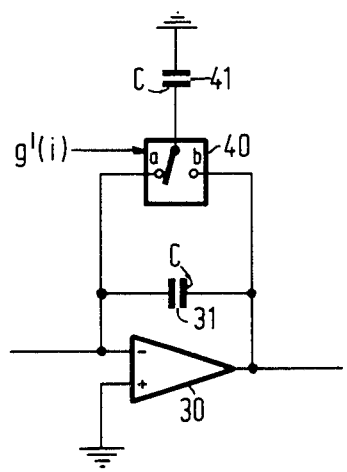

In the circuit shown in FIG. 5 the voltage at the capacitors 29(k) is maintained when the associated switches 28(k,1) and 28(k,2) interrupt the signal channel 26(k). Switches 28(k,1) and 28(k,2) can however alternatively be of such a construction that the capacitor is discharged when the signal channel 26(k) is interrupted. For the sake of completeness, such a modification of the circuit in FIG. 5 is shown in FIG. 11, which is not further described herein for the sake of brevity. When the switched capacitor circuits included in the signal channels are implemented as shown in FIG. 11, then capacitor 31 can also, and in the same way as capacitor 37, be shunted by a switched capacitor circuit. This is shown for the sake of completeness in FIG. 12, which also is not described further herein for the sake of brevity.

What is claimed is:

1. In a multiplying circuit for multiplying a first signal x(t) by a periodic second signal y(t) to produce a product signal z(t), such multiplying circuit comprising:
   a plurality N of signal channels for receiving the first signal, each such signal channel comprising:
   a switched-capacitor circuit which is switched by control pulses g(k,i) applied thereto of finite duration so as to convert the first signal into a sequence of pulses, where k is the number of the signal channel and $k=0, 1, 2, \ldots N-1$, and $i = \ldots -2, -1, 0, 1, 2, 3, \ldots$; and
   means connected to such switched-capacitor circuit for weighting the relative amplitudes of such sequence of pulses in accordance with a constant weighting factor W(k) such that $W(k) = y(t_0 + k(T_0/N))$, where $T_0$ and $t_0$ are constants, and for converting such pulses into pulses of predetermined duration, the resultant sequence of pulses being the channel output signal;
   pulse generating means connected to each of said signal channels for producing said control pulses g(k,i) with a repetition period $T_0$ and at instants $t_0 + k(T_0/N) + iT_0$; and
   means connected to said N signal channels for combining the channel output signals produced thereby, the combination of said signals being the product signal z(t);
   such multiplying circuit being characterized in that said means for combining the N channel output signals comprises:
   means for adding the N channel output signals to generate a sum signal; and
   a sampling circuit for sampling the sum signal during the intervals between successive control pulses, such sampled sum signal being the product signal z(t).

2. A multiplying circuit in accordance with claim 1, in which said means for weighting the relative amplitudes of said sequence of pulses is an operational amplifier connected in common to all of said signal channels.

3. A multiplying circuit in accordance with claim 2, in which said sampling circuit comprises: a switched-capacitor circuit connected to the output of said operational amplifier and controlled by control pulses $g'(k,i)$ each of which coincides with one of the control pulses $g(k,i)$, such control pulses $g'(k,i)$ being produced by said pulse generating means; and a holding circuit for maintaining the voltage produced by such switched-capacitor circuit during the intervals between successive control pulses $g'(k,i)$.

* * * * *